United States Patent [19]

Farwell

[11] Patent Number: 5,576,645
[45] Date of Patent: Nov. 19, 1996

[54] SAMPLE AND HOLD FLIP-FLOP FOR CMOS LOGIC

[75] Inventor: William D. Farwell, Thousand Oaks, Calif.

[73] Assignee: Hughes Aircraft Company, Los Angeles, Calif.

[21] Appl. No.: 465,669

[22] Filed: Jun. 5, 1995

[51] Int. Cl.⁶ .................................................. G11C 27/02
[52] U.S. Cl. .......................... 327/94; 327/200; 327/211; 327/218
[58] Field of Search .............................. 327/91, 94, 200, 327/201, 202, 203, 210, 211, 212, 218, 374, 214, 223, 263, 264, 285, 288

[56] References Cited

U.S. PATENT DOCUMENTS

| | | | |
|---|---|---|---|
| 4,656,368 | 4/1987 | McCombs et al. | 327/202 |
| 4,968,968 | 11/1990 | Taylor | 342/174 |
| 5,015,971 | 5/1991 | Taylor et al. | 331/16 |
| 5,065,057 | 11/1991 | Kawasaki | 327/391 |
| 5,081,377 | 1/1992 | Freyman | 327/211 |
| 5,111,072 | 5/1992 | Seidel | 327/94 |
| 5,130,714 | 7/1992 | Taylor | 342/132 |
| 5,189,315 | 2/1993 | Akata | 327/203 |

FOREIGN PATENT DOCUMENTS 2-104016  4/1990  Japan ..................................... 327/203

Primary Examiner—Timothy P. Callahan
Assistant Examiner—My-Trang Nu Ton
Attorney, Agent, or Firm—Leonard A. Alkov; Wanda K. Denson-Low

[57] ABSTRACT

A sample and hold flip-flop that includes a clock buffer circuit responsive to a first clock signal for producing a second clock signal and a third clock signal, wherein the second clock is delayed inverted replica of the first clock and wherein the third clock is a delayed inverted replica of the second clock signal; a CMOS inverter having an input and an output, wherein the output of said CMOS inverter forms the output of the sample and hold flip-flop; a first MOS transistor of a first type having a gate terminal connected to the first clock signal and a drain terminal connected to the input of the CMOS inverter; a second MOS transistor of the first type having a gate terminal connected to the second clock signal and a drain terminal being connected to the source terminal of the first MOS transistor of the first type; a first MOS transistor of a second type having a gate terminal connected to the second clock signal and a drain terminal connected to the input of the CMOS inverter; a second MOS transistor of the second type having a gate terminal connected to the third clock signal and a drain terminal connected to the source terminal of the first MOS transistor of the second type; and wherein the source terminal of the second MOS transistor of the first type and the source terminal of the second MOS transistor of the second type are connected together to form an input of the sample and hold flip-flop.

3 Claims, 2 Drawing Sheets

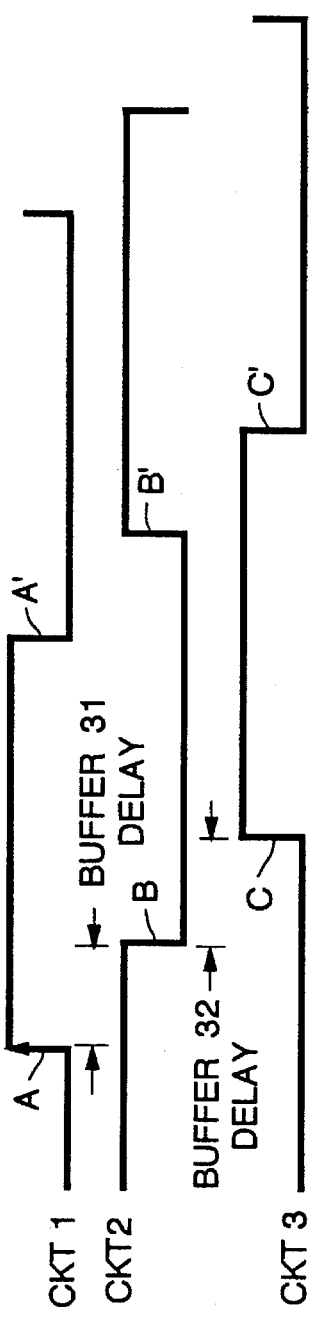
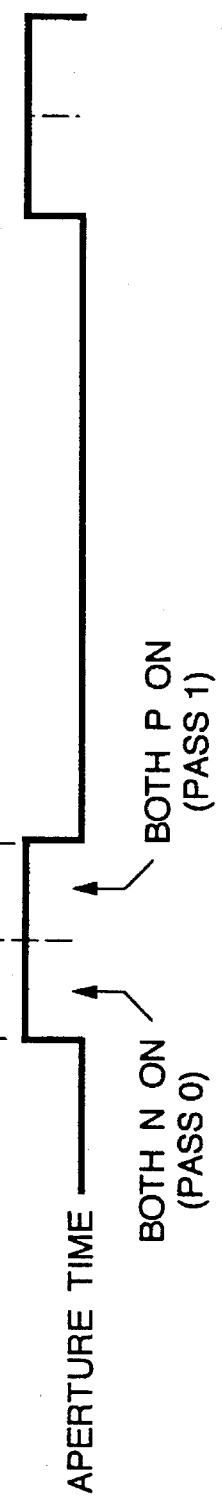
FIG. 2A.
FIG. 2B.
FIG. 2C.
FIG. 2D.
FIG. 2E.
FIG. 2F.
FIG. 2G.
FIG. 2H.

SAMPLE AND HOLD FLIP-FLOP FOR CMOS LOGIC

BACKGROUND OF THE INVENTION

The disclosed invention relates generally to flip-flop circuits, and more particularly to a sample and hold flip-flop for CMOS logic.

The flip-flop is a basic one-bit storage element that is a fundamental building block in digital integrated circuits. Flip-flops are used extensively to control and synchronize data flow in all forms of digital logic. In a typical digital integrated circuit, flip-flops and their ancillary clocking structures may occupy approximately one-half of the chip area and utilize approximately one-third of the power consumed by the integrated circuit. The most efficient flip-flops in terms of small size, fast speed, and low power consumption are dynamic flip-flops which employ the storage of electric charge as a means of operation. The term "dynamic" refers to the characteristic that charge cannot be stored indefinitely due to unavoidable leakage paths, and dynamic flip-flops must be refreshed by continuous clocking.

Most dynamic flip-flop designs require two or more clock phases, which complicates clock distribution in a complex digital integrated circuit. Known dynamic flip-flop designs that employ a single clock phase suffer from charge distribution effects, which reduce noise margin, or mitigate this problem by means which make them larger or slower.

A general consideration for all flip-flop designs is the desire for faster operating speeds to allow for faster information processing in the digital integrated circuits in which they are used.

SUMMARY OF THE INVENTION

It would therefore be an advantage to provide a dynamic flip-flop that utilizes only a single clock phase.

Another advantage would be to provide a dynamic flip-flop that is free of charge redistribution effects.

Still another advantage would be to provide a dynamic flip-flop that operates at increased speeds.

The foregoing and other advantages are provided by the invention in a dynamic sample and hold flip-flop that includes a clock buffer circuit responsive to a first clock signal for producing a second clock signal and a third clock signal, wherein the second clock is delayed inverted replica of the first clock and wherein the third clock is a delayed inverted replica of the second clock signal; a CMOS inverter having an input and an output, wherein the output of said CMOS inverter forms the output of the sample and hold flip-flop; a first MOS transistor of a first type having a gate terminal connected to the first clock signal and a drain terminal connected to the input of the CMOS inverter; a second MOS transistor of the first type having a gate terminal connected to the second clock signal and a drain terminal being connected to the source terminal of the first MOS transistor of the first type; a first MOS transistor of a second type having a gate terminal connected to the second clock signal and a drain terminal connected to the input of the CMOS inverter; a second MOS transistor of the second type having a gate terminal connected to the third clock signal and a drain terminal connected to the source terminal of the first MOS transistor of the second type; and wherein the source terminal of the second MOS transistor of the first type and the source terminal of the second MOS transistor of the second type are connected together to form an input of the sample and hold flip-flop.

BRIEF DESCRIPTION OF THE DRAWINGS

The advantages and features of the disclosed invention will readily be appreciated by persons skilled in the art from the following detailed description when read in conjunction with the drawing wherein:

FIGS. 2A–2H is a timing diagram that schematically depicts the operation of the sample and hold flip-flop of FIG. 1.

DETAILED DESCRIPTION OF THE DISCLOSURE

Figure 1:
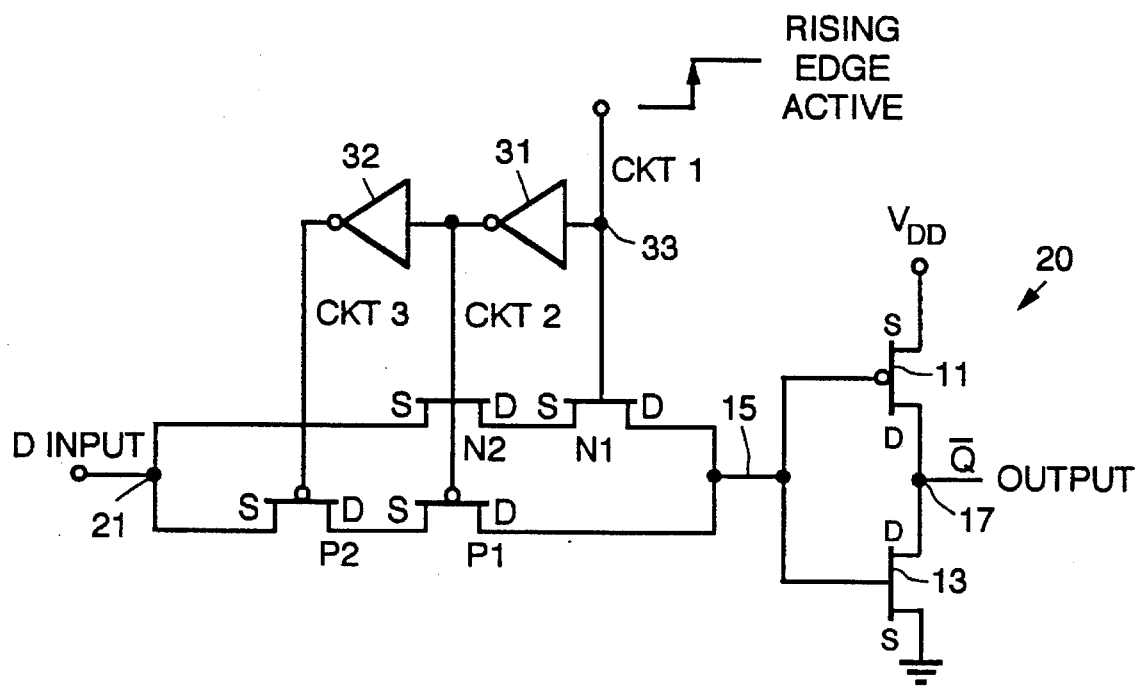
FIG. 1 is a schematic diagram of an implementation of a rising edge clocked dynamic sample and hold flip-flop in accordance with the invention.

In the following detailed description and in the several figures of the drawing, like elements are identified with like reference numerals.

Referring now to FIG. 1, set forth therein is a schematic diagram of an implementation of a rising edge clocked dynamic sample and hold (S/H) flip-flop in accordance with the invention. The S/H flip-flop of FIG. 1 includes a CMOS inverter 20 which forms an inverting output buffer of the flip-flop. The CMOS inverter 20 includes a p-channel MOS transistor 11 having a source that is connected to a positive bias voltage VDD and a drain that is connected to the drain of an n-channel MOS transistor 13 having a source connected to a reference potential which can be ground. The connection of the drain of the p-channel transistor 11 and the drain of the n-channel transistor 13 comprises an output node 17 which is the output node of the inverter 20 and the $\overline{Q}$ output node of the flip-flop. The $\overline{Q}$ output of the flip-flop is provided at the output node 17. The gate of the p-channel transistor 11 and the gate of n-channel transistor 13 are connected together and form an input node 15 for the inverter 20. As a result of parasitic gate to source capacitances of the p-channel transistor 11 and the n-channel transistor 13, the input node 15 of the inverter 20 has a capacitance associated therewith and forms a charge storage node.

The flip-flop of FIG. 1 further includes serially connected p-channel MOS transistors P1, P2 which are in parallel with serially connected n-channel MOS transistors N1, N2. In particular, the drain of the p-channel transistor P1 is connected to the input of the inverter 20, and the source of the p-channel transistor P1 is connected to the drain of the p-channel transistor P2. The drain of the n-channel transistor N1 is connected to the input of the inverter 20, and the source of the n-channel transistor N1 is connected to the drain of the n-channel transistor N2. The source of the p-channel transistor P2 and the source of the n-channel transistor N2 are connected together to form an input node 21 which comprises a D input node to the flip-flop for receiving the D input to the flip-flop.

The gate of the n-channel transistor N1 is connected to the input of a first inverting clock buffer 31 to form a clock node 33 which receives a first clock signal CK1. The output of the first inverting clock buffer 31 provides a second clock signal CK2' which is a delayed and inverted replica of the first clock signal CK1, wherein the delay comprises one clock buffer delay. The output of the first inverting clock buffer 31 is connected to the gate of the n-channel transistor N2 and the gate of the p-channel transistor P1, and also to the input of a second inverting clock buffer 32. The output of the second inverting clock buffer 32 provides a third clock signal CK3 which is a delayed and inverted replica of the second clock signal. Thus, the third clock signal is a delayed replica of the first clock signal wherein the delay comprises two clock buffer delays. By way of illustrative example, each of the inverting clock buffers 31, 32 comprises a CMOS inverter of substantially the same structure as the CMOS inverter 20 which forms the output buffer of the flip-flop of FIG. 1.

The network of transistors P1, P2, N1, and N2 form a switching network between the D input 21 of the flip-flop and the input node 15 of the inverter 20. As described more fully herein, the flip-flop functions include updating, which occurs at the rising edge of the first clock signal CK1, and holding which occurs in the interval between updating. During updating, the switching network provides a low impedance path between the D input 21 and the node 15, which allows a small current to flow between the D input 21 and the node 15. Such current charges or discharges the capacitance of the node 15, depending on the direction of flow of the small current, so that the voltage at node 15 becomes substantially the same as the update voltage at the D input 21 of the flip-flop. During holding, the switching network presents a very high impedance between the D input 21 and the node 15. Thus, during holding charge is trapped on the capacitance of the node 15, and a voltage is stored on the node 15 which is substantially the same as the update voltage provided at the D input node 21 during the immediately preceding update period, regardless of changes of the voltage at the D input 21 during the holding period. The $\overline{Q}$ output of the output buffer 20 comprises the inverse of the voltage of the node 15.

It is noted that the output buffer 20 forms a dynamic storage element which is well known in the art.

Referring now to FIGS. 2A–2H, set forth therein is a timing diagram that is helpful in understanding the operation of the sample and hold flip-flop of FIG. 1. Prior to the occurrence of a rising edge A of the first clock signal CK1, the second clock signal CK2' is high, and the third clock signal is low. Thus, prior to the rising edge A of the first clock signal CK1, the n-channel transistor N1 is off, the n-channel transistor N2 is on, the p-channel transistor P1 is off, and the p-channel transistor P2 is on. The path between the D input 21 and the node 15 therefore comprises a high impedance prior to the rising edge A. Pursuant to the rising edge A of the first clock signal CK1, the n-channel transistor N1 goes on. The n-channel transistor N2 remains on, the p-channel transistor P1 remains off, and the p-channel transistor P2 remains on.

After a delay provided by the first clock buffer 31 relative to the rising edge A, the second clock signal CK2 provides a falling edge B. Pursuant to the falling edge B, the n-channel transistor N2 goes off, and the p-channel transistor P1 goes on. The n-channel transistor N1 remains on, and the p-channel transistor P2 remains on.

After a delay provided by the second clock buffer 32 relative to the falling edge B, the third clock signal CK3 provides a rising edge C. Pursuant to the rising edge C, the p-channel transistor P2 goes off. The n-channel transistor N1 remains on, the n-channel transistor N2 remains off, and the p-channel transistor P1 remains on.

During the time interval between the rising edge A and the falling edge B, both n-channel transistors N1, N2 are on, the p-channel transistor P1 is off, and the p-channel transistor P2 is on. During time interval between the falling edge B and the rising edge C, both p-channel transistors P1, P2 are on, the n-channel transistor N1 is on, and the n-channel transistor N2 is off. Thus, if the D input to the flip-flop is a logical low, such logical low signal is passed from the input node of the flip-flop to the input of the inverter 20 during the time interval between the rising edge A and the falling edge B. The time interval between the rising edge A of the first clock signal CK1 and the falling edge B of the second clock signal CK2 is therefore a sampling period, or aperture time, for logical low inputs to the flip-flop. If the D input to the flip-flop is a logical high, such logical high signal is passed from the input node of the flip-flop to the input of the inverter 20 during the time interval between the falling edge B and the rising edge C. The time interval between the falling edge B of the second clock signal CK2 and the rising edge C of the third clock signal CK3 is therefore a sampling period, or aperture time, for logical high inputs to the flip-flop. The total sampling period, or aperture time, for input to the flip-flop in general is thus the time between the rising edge A of the first clock signal CK1 and the rising edge C of the third clock signal CK3, and the input signal must remain stable during such total sampling period.

The first clock signal CK1 eventually provides a falling edge A', which causes the n-channel transistor N1 to go off. The n-channel transistor N2 remains off, the p-channel transistor P1 remains on, and the p-channel transistor P2 remains off.

After a delay provided by the first clock buffer 31 relative to the falling edge A', the second clock signal CK2 provides a rising edge B'. Pursuant to the rising edge B', the n-channel transistor N2 goes on, and the p-channel transistor P1 goes off. The n-channel transistor N1 remains off, and the p-channel transistor P2 remains off.

After a delay provided by the second clock buffer 32 relative to the rising edge B', the third clock signal CK3 provides a falling edge C'. Pursuant to the falling edge C', the p-channel transistor P2 goes on The n-channel transistor N1 remains off, the n-channel transistor N2 remains on, and the p-channel transistor P1 remains off.

The foregoing cycle repeats again pursuant to another rising edge of the first clock signal CK1.

Figure 3:
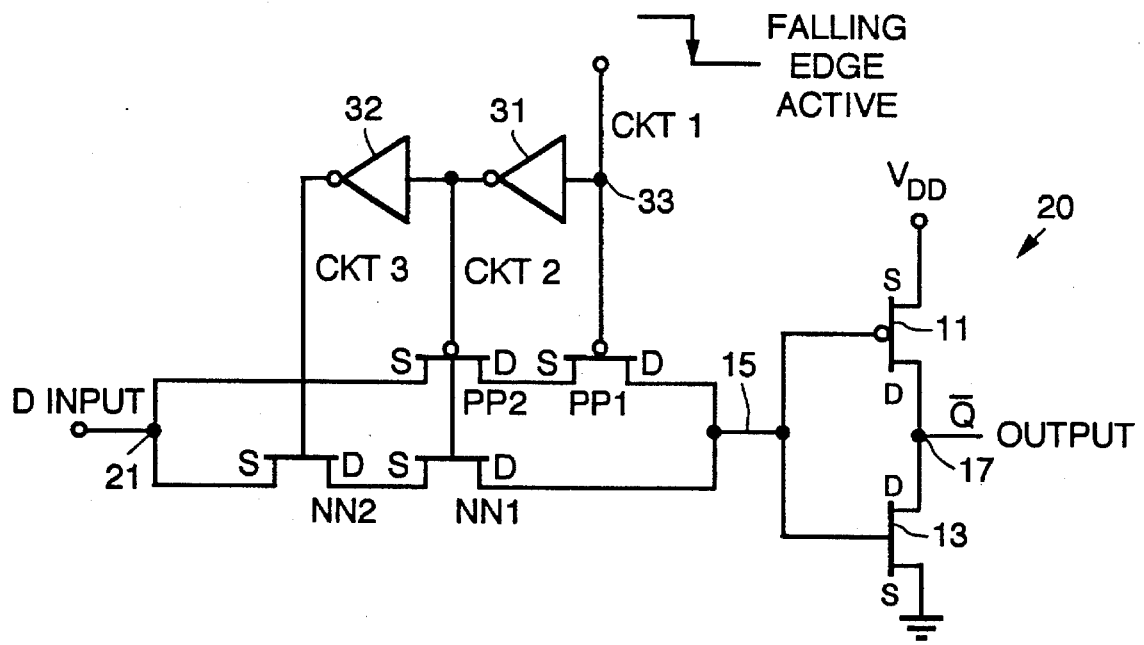
FIG. 3 is a schematic diagram of an implementation of a falling edge clocked dynamic sample and hold flip-flop in accordance with the invention.

Referring now to FIG. 3, set forth therein is a schematic diagram of an implementation of a falling edge clocked dynamic sample and hold (S/H) flip-flop in accordance with the invention. The S/H flip-flop of FIG. 3 includes a CMOS inverter 20 which forms an inverting output buffer of the flip-flop. The CMOS inverter 20 includes a p-channel MOS transistor 11 having a source that is connected to a positive bias voltage VDD and a drain that is connected to the drain of an n-channel MOS transistor 13 having a source connected to a reference potential which can be ground. The connection of the drain of the p-channel transistor 11 and the drain of the n-channel transistor 13 comprises an output node 17 which is the output node of the inverter 20 and the $\overline{Q}$ output node of the flip-flop. The $\overline{Q}$ output of the flip-flop is provided at the output node 17. The gate of the p-channel transistor 11 and the gate of n-channel transistor 13 are connected together and form an input node 15 for the inverter 20.

The flip-flop of FIG. 3 further includes serially connected p-channel MOS transistors PP1, PP2 which are in parallel with serially connected n-channel MOS transistors NN1, NN2. In particular, the drain of the p-channel transistor PP1 is connected to the input of the inverter 120, and the source of the p-channel transistor PP1 is connected to the drain of the p-channel transistor PP2. The drain of the n-channel transistor NN1 is connected to the input of the inverter 20, and the source of the n-channel transistor NN1 is connected to the drain of the n-channel transistor NN2. The source of the p-channel transistor PP2 and the source of the n-channel transistor NN2 are connected together to form an input node 21 which comprises a D input node to the flip-flop for receiving the D input to the flip-flop.

The gate of the p-channel transistor PP1 is connected to the input of a first inverting clock buffer 31 to form a clock node 33 which receives a first clock signal CK1. The output of the first inverting clock buffer 31 provides a second clock signal CK2 which is a delayed and inverted replica of the first clock signal CK1, wherein the delay comprises one clock buffer delay. The output of the first clock buffer 31 is connected to the gate of the n-channel transistor NN2 and the gate of the p-channel transistor PP1, and also to the input of a second inverting clock buffer 32. The output of the second inverting clock buffer 32 provides a third clock signal CK3 which is a delayed and inverted replica of the second clock signal. Thus, the third clock signal is a delayed replica of the first clock signal wherein the delay comprises two clock buffer delays. By way of illustrative example, each of the inverting clock buffers 31, 32 comprises a CMOS inverter of substantially the same structure as the CMOS inverter 20 which forms the output buffer of the flip-flop of FIG. 3.

The sample and hold flip-flop of FIG. 3 operates similarly to the sample and hold flip-flop of FIG. 1, except that the transfer of data from the D input of the flip-flop to the $\overline{Q}$ output of the flip-flop takes place pursuant to (1) a falling edge of the first clock signal CK1, (2) a rising edge of the second clock signal that is delayed relative to the falling edge of the first clock signal, and (3) a falling edge of the third clock signal which is delayed relative to the rising edge of the second clock signal.

During the time interval between the falling edge of the first clock signal CK1 and the rising edge of the second clock signal CK2, both p-channel transistors PP1, PP2 are on, the n-channel transistor NN1 is off, and the n-channel transistor NN2 is on. During time interval between the rising edge of the second clock signal CK2 and the falling edge of the third clock signal CK3, both N-channel transistors NN1, NN2 are on, the p-channel transistor PP1 is on, and the p-channel transistor PP2 is off. Thus, if the D input to the flip-flop is a logical high, such logical high signal is passed from the input node of the flip-flop to the input of the inverter 20 during the time interval between the falling edge of the first clock signal CK1 and the rising edge of the second clock signal CK2. If the D input to the flip-flop is a logical low, such logical low signal is passed from the input node of the flip-flop to the input of the inverter 20 during the time interval between the rising edge of the second clock signal CK2 and the falling edge of the third clock signal CK3.

Effectively, the timing for the sample and hold flip-flop of FIG. 3 is similar to the timing for the sample and hold flip-flop of FIG. 1 as illustrated in FIG. 2, except that the clock signals would be inverted, and the on/off states of the p-channel transistors PP1, PP2 would correspond to the on/off states of the n-channel transistors N1, N2, while the on/off states of the n-channel transistors NN1, NN2 would correspond to the on/off states of the p-channel transistors P1, P2.

The foregoing has been a disclosure of a flip-flop that advantageously provides for decreased insertion delay and decreased power consumption, requires fewer transistors, and is free of timing race conditions and charge redistribution effects.

Although the foregoing has been a description and illustration of specific embodiments of the invention, various modifications and changes thereto can be made by persons skilled in the art without departing from the scope and spirit of the invention as defined by the following claims.

What is claimed is:

1. A sample and hold flip-flop comprising:

clocking means responsive to a first clock signal for producing a second clock signal and a third clock signal, wherein the second clock signal is delayed inverted replica of the first clock signal and wherein the third clock signal is a delayed inverted replica of the second clock signal;

a CMOS inverter having an input and an output, wherein said output of said CMOS inverter forms the output of the sample and hold flip-flop;

a first MOS transistor of a first type having a gate terminal, a source terminal, and a drain terminal, said gate terminal being connected to said first clock signal and said drain terminal being connected to said input of said CMOS inverter;

a second MOS transistor of the first type having a gate terminal, a source terminal, and a drain terminal, said gate terminal connected to said second clock signal, and said drain terminal being connected to said source terminal of said first MOS transistor of the first type;

a first MOS transistor of a second type having a gate terminal, a source terminal, and a drain terminal, said gate terminal being connected to said second clock signal and said drain terminal being connected to said input of said CMOS inverter;

a second MOS transistor of the second type having a gate terminal, a source terminal, and a drain terminal, said gate terminal being connected to said third clock signal, and said drain terminal connected to said source terminal of said first MOS transistor of the second type; and wherein said source terminal of said second MOS transistor of the first type and said source terminal of said second MOS transistor of the second type are connected together to form an input of the sample and hold flip-flop.

2. The sample and hold flip-flop of claim 1 wherein said first MOS transistor of the first type and said second MOS transistor of the first type comprise first and second n-channel transistors, and wherein said first MOS transistor of the second type and said second MOS transistor of the second type comprise first and second p-channel transistors.

3. The sample and hold flip-flop of claim 1 wherein said first MOS transistor of the first type and said second MOS transistor of the first type comprise first and second p-channel transistors, and wherein said first MOS transistor of the second type and said second MOS transistor of the second type comprise first and second n-channel transistors.

\* \* \* \* \*